(12) United States Patent
Arai

(10) Patent No.: US 7,138,679 B2
(45) Date of Patent: Nov. 21, 2006

(54) SEMICONDUCTOR MEMORY DEVICE

(75) Inventor: Hajime Arai, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/957,961

(22) Filed: Oct. 5, 2004

(65) Prior Publication Data
US 2005/0077565 A1 Apr. 14, 2005

(30) Foreign Application Priority Data
Oct. 10, 2003 (JP) ............... 2003-352514

(51) Int. Cl.
H01L 29/76 (2006.01)
(52) U.S. Cl. ............... 257/314; 257/315; 257/E29.129
(58) Field of Classification Search ............... 257/314, 257/315, E29.129; 438/201, 211, 257
See application file for complete search history.

(56) References Cited

U.S. PATENT DOCUMENTS

| | | | | |
|---|---|---|---|---|
| 5,460,988 A | * | 10/1995 | Hong | 438/259 |
| 5,554,550 A | * | 9/1996 | Yang | 438/259 |
| 5,739,567 A | * | 4/1998 | Wong | 257/316 |
| 6,486,028 B1 | * | 11/2002 | Chang et al. | 438/259 |
| 6,548,856 B1 | | 4/2003 | Lin et al. | |
| 6,794,249 B1 | * | 9/2004 | Palm et al. | 438/259 |
| 6,861,685 B1 | * | 3/2005 | Choi | 257/288 |
| 2003/0235076 A1 | * | 12/2003 | Forbes | 365/185.03 |
| 2004/0041214 A1 | * | 3/2004 | Prall | 257/390 |
| 2004/0094781 A1 | * | 5/2004 | Hsiao et al. | 438/257 |
| 2005/0030780 A1 | * | 2/2005 | Deppe et al. | 365/123 |
| 2005/0133860 A1 | * | 6/2005 | Forbes | 257/330 |
| 2005/0164456 A1 | * | 7/2005 | Deppe et al. | 438/275 |

FOREIGN PATENT DOCUMENTS

JP 2002-237540 A 8/2002

* cited by examiner

Primary Examiner—Eugene Lee
(74) Attorney, Agent, or Firm—McDermott Will & Emery LLP

(57) ABSTRACT

A semiconductor memory device comprises a silicon substrate having a main surface, a trench formed on the silicon substrate to open in the main surface and a memory cell formed on the trench. The memory cell includes a first storage holding part formed on a first side wall of the trench, a second storage holding part formed on a second side wall of the trench, impurity diffusion layers formed on both sides of the trench and a gate electrode formed to extend from the trench onto the impurity diffusion layers for covering the first and second storage holding parts.

1 Claim, 9 Drawing Sheets

SEMICONDUCTOR MEMORY DEVICE

BACKGROUND OF THE INVENTION

1. Field of the Invention

The present invention relates to a semiconductor memory device and a method of fabricating the same, and more particularly, it relates to a semiconductor memory device storing data by injecting charges into charge holding insulator films and a method of fabricating the same.

2. Description of the Background Art

A semiconductor memory device storing data by injecting charges into charge holding insulator films is known in general. This semiconductor memory device has memory cells each including a multilayer structure of a silicon oxide film, a silicon nitride film and another silicon oxide film formed on a portion of a silicon substrate located between isolation films, a gate electrode provided on the multilayer structure and a pair of impurity regions for forming source/drain regions on both sides of the multilayer structure, for example.

Each memory cell has two storage holding regions partially formed by the aforementioned multilayer structure in the vicinity of the pair of impurity regions, for writing data by injecting hot electrons into the storage holding regions. At this time, the semiconductor memory device can store data by injecting hot electrons into the two storage holding regions of each memory cell respectively, whereby data of two bits can be stored in each memory cell.

In the aforementioned memory cell, however, the two storage holding regions are connected with each other through the silicon nitride film and hence charges stored in the storage holding regions are canceled due to hole conduction through the silicon nitride film to disadvantageously reduce the data holding property.

For example, Japanese Patent Laying-Open No. 2002-237540 describes a semiconductor device capable of solving this problem. The semiconductor device described in this literature stores information by trapping carriers in central layers of three-layer insulator films formed on the side surfaces of gate electrodes of FETs (field-effect transistors), and hence the aforementioned reduction of the data holding property resulting from hole conduction can be inhibited.

In the semiconductor device described in Japanese Patent Laying-Open No. 2002-237540, however, the three-layer insulator films are formed from the side surfaces of the gate electrodes onto a substrate while side wall spacers are further formed thereon, and hence the transverse width of memory cells in a direction parallel to the main surface of the substrate is inevitably increased. Therefore, the memory cells are disadvantageously increased in size.

SUMMARY OF THE INVENTION

The present invention has been proposed in order to solve the aforementioned problems, and an object thereof is to provide a semiconductor memory device capable of improving the data holding property and simplifying refinement of memory cells and a method of fabricating the same.

The semiconductor memory device according to the present invention comprises a first conductivity type semiconductor substrate (including a first conductivity type well) having a main surface, a trench formed on the semiconductor substrate to open in the main surface and a memory cell formed on the trench. The memory cell includes a first storage holding part formed on a first side wall of the trench, a second storage holding part formed on a second side wall of the trench, second conductivity type first and second impurity diffusion layers formed on both sides of the trench and a gate electrode formed to extend from the trench onto the first and second impurity diffusion layers for covering the first and second storage holding parts.

The first storage holding part is formed on the first side wall of the trench while the second storage holding part is formed on the second side wall of the trench as hereinabove described, whereby data of two bits can be stored in a single memory cell. Further, the storage holding parts are separately provided on the first and second side walls of the trench, whereby charges stored in the storage holding parts can be inhibited from cancellation resulting from conduction of holes or the like. Thus, the semiconductor memory device can attain an excellent data holding property. Further, the storage holding parts are so formed in the trench that the memory cell can be inhibited from transverse spreading in the direction parallel to the main surface of the substrate and reduced in size.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Semiconductor memory devices according to embodiments of the present invention and methods of fabricating the same are now described with reference to FIGS. 1 to 23.

The semiconductor memory device according to each embodiment of the present invention is a nonvolatile semiconductor memory device such as an NROM (nitride read-only memory), for example, having a memory cell array formed with a plurality of memory cells (memory cell transistors) and a peripheral circuit part formed with a peripheral circuit controlling operations of the memory cells. Each memory cell has charge holding insulator films, for storing data by injecting charges into the charge holding insulator films.

(First Embodiment)

Figure 1:
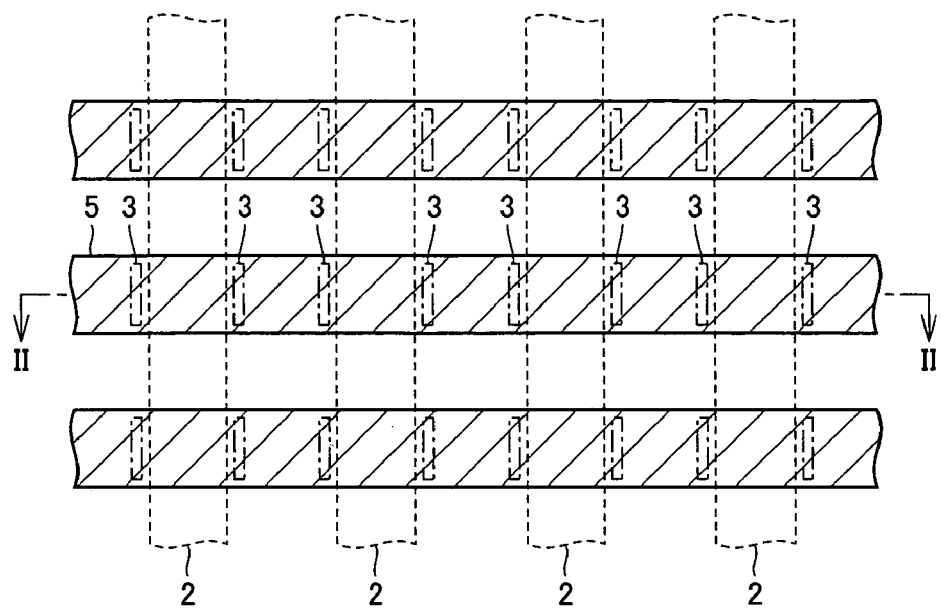
FIG. 1 is a partially fragmented plan view of a semiconductor memory device according to a first embodiment of the present invention.
Figure 2:
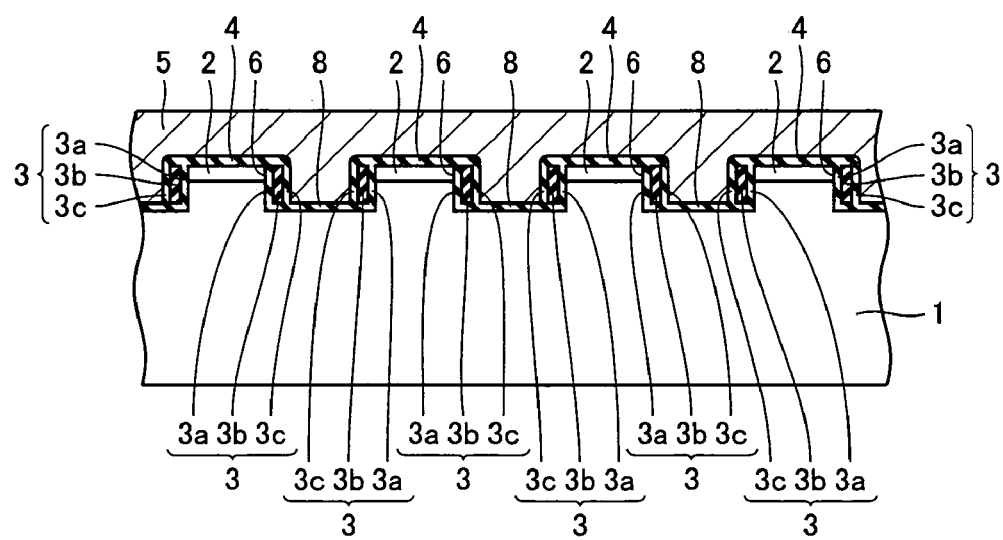
FIG. 2 is a sectional view taken along the line II—II in FIG. 1.
Figure 3:
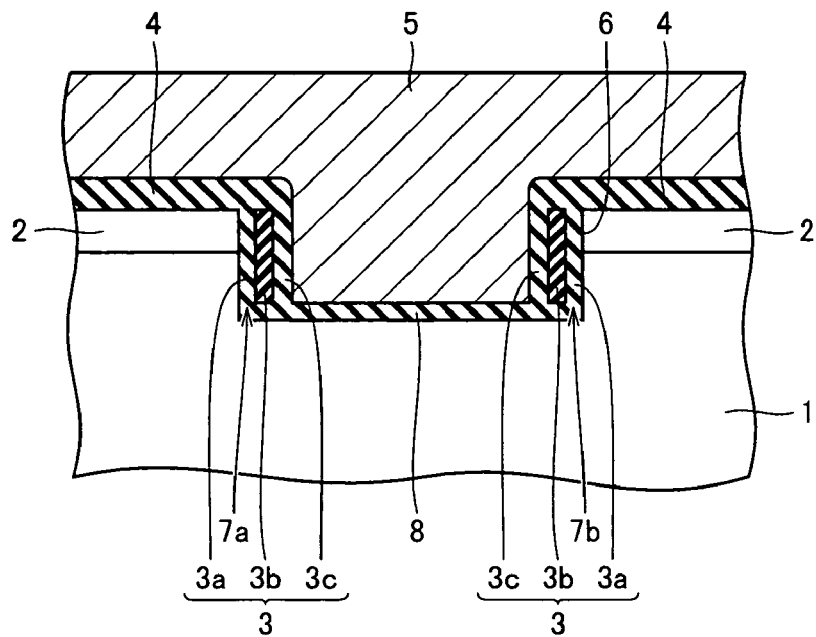
FIG. 3 is a sectional view showing a memory cell of the semiconductor memory device according to the first embodiment of the present invention.

FIG. 1 is a partially fragmented plan view of a memory cell array in a semiconductor memory device according to a first embodiment of the present invention, FIG. 2 is a sectional view taken along the line II—II in FIG. 1, and FIG. 3 is a sectional view of each memory cell.

As shown in FIG. 1, a plurality of impurity diffusion layers 2 forming source/drain regions of memory cells extend in the vertical direction while gate electrodes 5 extend in a transverse direction perpendicular to the extensional direction of the impurity diffusion layers 2. Pairs of multilayer or stacked films 3 for forming storage holding parts are formed immediately under the gate electrodes 5. The multilayer films 3 are formed on side walls of trenches 6 formed between the impurity diffusion layers 2 in both of the extensional direction of the gate electrodes 5 and that of the impurity diffusion layers 2 (the extensional direction of the trenches 6) intermittently through isolation films. Therefore, each memory cell has an independent pair of multilayer films 3, i.e., an independent pair of storage holding parts.

As shown in FIG. 2, the trenches 6 are formed to open in a main surface of a p-type (first conductivity type) silicon substrate (semiconductor substrate) 1. Alternatively, a p-type well may be formed on the main surface of a silicon substrate for forming the trenches 6 to open in the surface of the p-type well.

The n-type (second conductivity type) impurity diffusion layers 2 are formed on portions of the surface of the silicon substrate 1 located on both sides of the trenches 6 extending in parallel with the impurity diffusion layers 2. The conductivity type of the impurity diffusion layers 2 may be simply different from that of the silicon substrate 1 or the well. When an n-type silicon substrate 1 or an n-type well is employed, for example, p-type impurity diffusion layers 2 may be formed.

The multilayer films 3 are formed on opposite pairs of side walls of the trenches 6 respectively. The multilayer films 3 are formed by ONO films prepared by stacking first silicon oxide films (bottom oxide films: first oxide films) 3a, silicon nitride films 3b and second silicon oxide films (top oxide films: second oxide films) 3c respectively. These multilayer films 3 function as charge holding insulator films or charge capturing films (films having traps capturing charges).

Regions close to the bottom surfaces of the trenches 6 located between the multilayer films 3 correspond to central portions of channel regions of the memory cells. Gate oxide films (gate insulator films) 8 constituted of silicon oxide films or the like are formed on the bottom surfaces of the trenches 6. Insulator films such as silicon oxide films 4 electrically isolating the gate electrodes 5 and the impurity diffusion layers 2 from each other are also formed on the impurity diffusion layers 2. The gate electrodes 5 are formed to extend on the silicon oxide films 4, the multilayer films 3 and the gate oxide films 8.

As shown in FIG. 3, each memory cell, formed on each trench 6, includes a first storage holding part 7a formed on a first side wall of the trench 6, a second storage holding part 7b formed on a second side wall of the trench 6, each pair of impurity diffusion layers 2 formed on both sides of the trench 6, each gate oxide film 8, each silicon oxide film 4 and each gate electrode 5 formed to extend from the trench 6 onto the impurity diffusion layers 2 for covering the first and second storage holding parts 7a and 7b. The first and second storage holding parts 7a and 7b are constituted of parts of the multilayer films 3 respectively. More detailedly, the first and second storage holding parts 7a and 7b are mainly constituted of the silicon nitride films 3b. The first and second storage holding parts 7a and 7b are not connected with each other through these silicon nitride films 3b, while the silicon nitride films 3b in the first and second storage holding parts 7a and 7b are isolated from each other by the gate oxide film 8.

A data write operation in each memory cell is now described.

In order to write data in the first storage holding part 7a, a voltage of about: 3 to 5 V is applied to the impurity diffusion layer 2 closer to the first storage holding part 7a and a voltage of about 5 to 10 V is applied to the gate electrode 5 while the impurity diffusion layer 2 closer to the second storage holding part 7b and the silicon substrate 1 or the well are set to a ground level. Thus, hot electrons can be generated in the vicinity of the first storage holding part 7a, so that these hot electrons can be injected into trap levels in the vicinity of the interfaces between the first and second oxide films 3a and 3c and the silicon nitride film 3b and captured.

In order to write data in the second storage holding part 7b, on the other hand, a voltage of about 3 to 5 V is applied to the impurity diffusion layer 2 closer to the second storage holding part 7b and a voltage of about 5 to 10 V is applied to the gate electrode 5 while the impurity diffusion layer 2 closer to the first storage holding part 7a and the silicon substrate 1 or the well are set to the ground level. Thus, hot electrons can be generated in the vicinity of the second storage holding part 7b, so that these hot electrons can be injected into trap levels in the vicinity of the interfaces between the first and second oxide films 3a and 3c and the silicon nitride film 3b and captured. Thus, data can be written in each memory cell.

A data read operation is now described.

In order to read whether or not data is written in the first storage holding part 7a, i.e., whether or not electrons are injected into the first storage holding part 7a, the impurity diffusion layers 2 closer to the first and second storage holding parts 7a and 7b are employed as a source and a drain respectively for reading data.

If electrons are injected into the first storage holding part 7a, the memory cell is reduced in drivability and relatively increased in threshold voltage due to these electrons. If no electrons are injected into the first storage holding part 7a, on the other hand, the memory cell is not reduced in drivability and hence relatively reduced in threshold voltage. It is possible to determine whether or not data is written in the first storage holding part 7a through this characteristic.

In order to read whether or not data is written in the second storage holding part 7b, on the other hand, the impurity diffusion layers 2 closer to the second and first storage holding parts 7b and 7a are employed as a source and a drain respectively for reading data.

Also in this case, the memory cell is reduced in drivability and relatively increased in threshold voltage if electrons are injected into the second storage holding part 7b while the memory cell is not reduced in drivability and hence relatively reduced in threshold voltage if no electrons are injected into the second storage holding part 7b. It is possible to determine whether or not data is written in the second storage holding part 7b through this characteristic.

In order to erase data stored in the memory cell, a voltage of about 3 to 7 V is applied to either impurity diffusion layer 2 while a negative voltage of about −5 to −10 V is applied to the gate electrode 5. Thus, electrons captured in the first or second storage holding part 7a or 7b can be extracted or holes can be injected into the first or second storage holding part 7a or 7b, for erasing the data stored in the memory cell.

As hereinabove described, each memory cell provided with the two independent (isolated, for example) storage holding parts 7a and 7b can store data for two bits. Further, the storage holding parts 7a and 7b are so independent of each other that stored charges can be inhibited from canceling each other due to hole conduction through the storage holding parts 7a and 7b or the like. Thus, the semiconductor memory device can attain an excellent data holding property.

Further, the storage holding parts 7a and 7b are so formed in the trench 6 that the memory cell can be inhibited from spreading in the transverse direction (the direction parallel to the main surface of the substrate 1) and refined. Further, a channel of the memory cell can be so three-dimensionally formed along the trench 6 that the memory cell can be refined while improving punch-through resistance.

A method of fabricating the semiconductor memory device according to the first embodiment is now described with reference to FIGS. 4 to 8.

Figure 4:
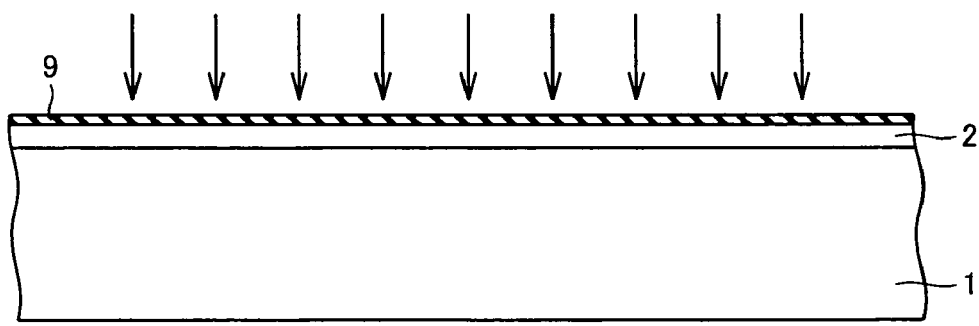
FIGS. 4 to 8 are sectional views showing first to fifth steps of manufacturing the semiconductor memory device according to the first embodiment of the present invention.

As shown in FIG. 4, a silicon oxide film 9 for preventing damage and contamination in impurity introduction is formed on the main surface of the p-type silicon substrate 1 (or a p-type well) by thermal oxidation or the like with a thickness of about 5 to 30 nm. Thereafter an n-type impurity is introduced into the overall portion of the surface of the silicon substrate 1 located in the memory cell array by about 0.1 to $5 \times 10^{15}/cm^2$, thereby forming the impurity diffusion layers 2.

Figure 5:
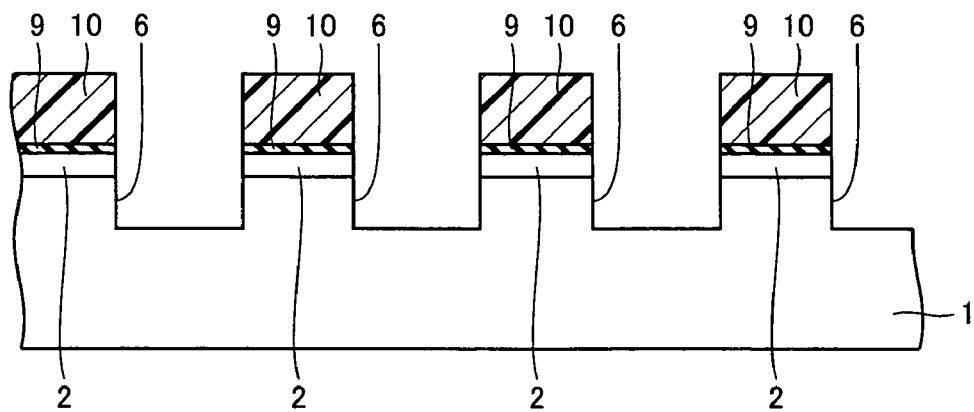

As shown in FIG. 5, a resist pattern 10 is formed on the silicon oxide film 9 by photolithography and employed as a mask for etching the silicon oxide film 9 and the silicon substrate 1. Thus, the impurity diffusion layers 2 can be left on both sides of the trenches 6 in a self-aligned manner while forming the plurality of trenches 6 to pass through the impurity diffusion layer 2 and open in the main surface of the silicon substrate 1.

Figure 6:
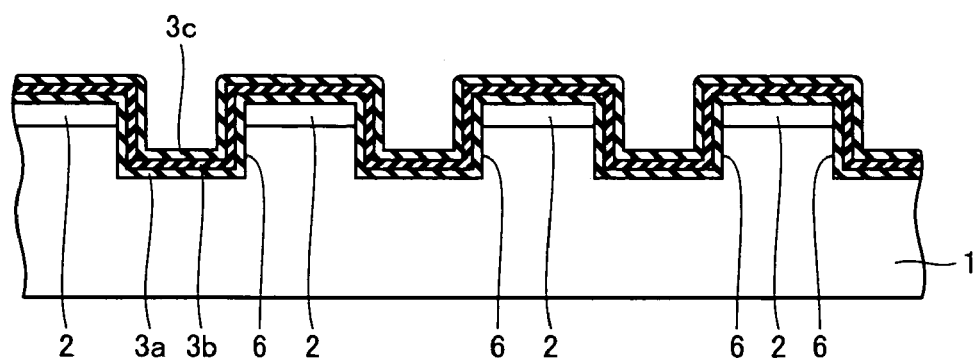

The resist pattern 10 is removed so that the first silicon oxide films 3a of about 1 to 5 nm in thickness are thereafter formed on the surfaces of the trenches 6 and the impurity diffusion layers 2 by thermal oxidation or the like, and the silicon nitride films 3b of about 3 to 10 nm in thickness are deposited on the first silicon oxide films 3a by CVD (chemical vapor deposition) or the like, as shown in FIG. 6. Then, the surfaces of the silicon nitride films 3b are thermally oxidized for forming thermal oxide films of about 0.5 to 5 nm in thickness on the surfaces of the silicon nitride films 3b or oxide films of about 2 to 8 nm in thickness are deposited on the surfaces of the silicon nitride films 3b by CVD or the like. Thus, the second silicon oxide films 3c can be formed on the surfaces of the silicon nitride films 3b for forming the ONO films constituted of the second silicon oxide films 3c, the silicon nitride films 3b and the first silicon oxide films 3a.

Figure 7:
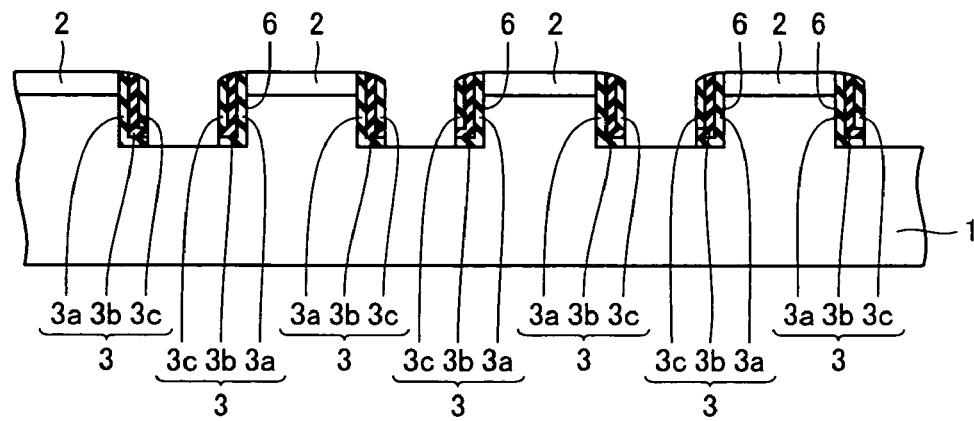

As shown in FIG. 7, the ONO films are etched back by anisotropic dry etching, thereby partially removing the ONO films from the surfaces of the impurity diffusion layers 2 and the bottoms of the trenches 6 and exposing parts of the bottom surfaces of the trenches 6 and the impurity diffusion layers 2 while leaving the ONO films on the side walls of the trenches 6. Thus, the pairs of multilayer films 3 constituted of the ONO films can be formed on the opposite side walls of the trenches 6.

Figure 8:
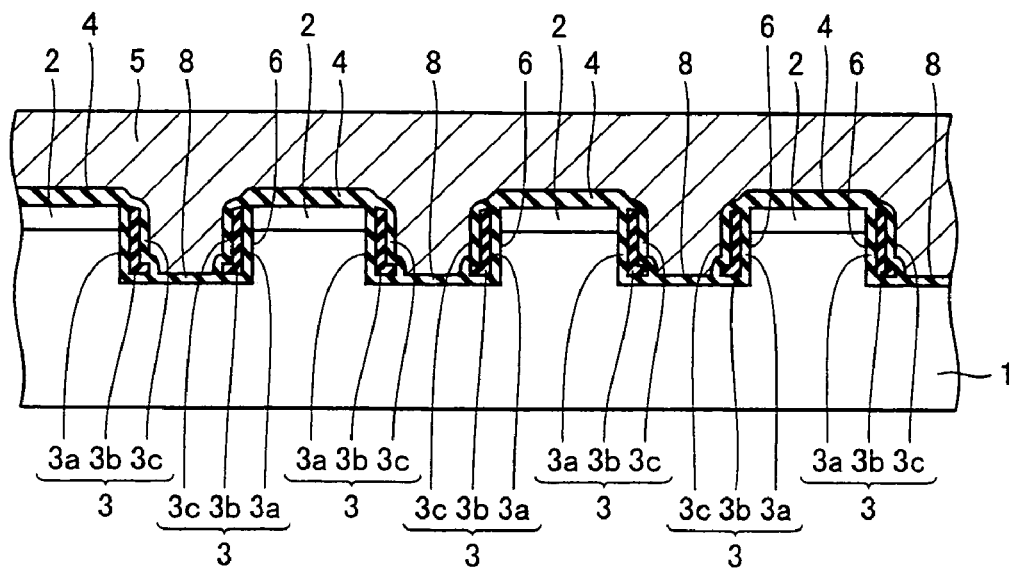

Then, silicon oxide films are formed on the main surface of the silicon substrate 1 (the surfaces of the impurity diffusion layers 2) and the bottoms of the trenches 6. Thus, the silicon oxide films 4 and the gate oxide films 8 can be formed as shown in FIG. 8. At this time, the silicon oxide films 4 are larger in thickness than the gate oxide films 8 due to the impurity introduced into the impurity diffusion layers 2 in a relatively high concentration.

Then, conductor films of polysilicon or the like serving as the materials for the gate electrodes 5 are deposited on the silicon oxide films 4, the gate oxide films 8 and the multilayer films 8 by CVD or the like. These conductor films are so etched as to form strip-shaped conductor film patterns extending perpendicularly to the impurity diffusion layers 2. Thus, the gate electrodes 5 can be formed. Thereafter a p-type impurity is introduced into the spaces between the gate electrodes 5, thereby forming element isolation regions.

Also after the gate electrodes 5 are formed in the aforementioned manner, the silicon nitride films 3b continuously remain along the side walls of the trenches 6, whereby the ONO films (multilayer films) located under the adjacent gate electrodes 5 are connected with each other through the silicon nitride films 3b.

Therefore, the silicon nitride films 3b located between the gate electrodes 5 are oxidized by high-temperature wet oxidation (ISSG (in-situ stream generation), for example) after formation of the gate electrodes 5, for converting the silicon nitride films 3b to silicon oxide films. Thus, the storage holding parts 7a and 7b of the memory cells can be prevented from connection through the silicon nitride films 3b, so that stored charges can be inhibited from disappearance resulting from hole conduction. The step of selectively oxidizing the silicon nitride films 3b along the side walls of the trenches 6 may alternatively be carried out before formation of the gate electrodes 5.

Thereafter an interlayer dielectric film is deposited by CVD or the like to cover the gate electrodes 5, contact holes are formed in the interlayer dielectric film, conductor films are deposited in the contact holes and/or on the interlayer dielectric film by CVD or the like and the conductor films are patterned by etching or the like thereby forming wiring patterns. These steps are repeated at need, for forming a multilevel interconnection structure. A protective film is finally formed on the surface of the semiconductor memory device and an external connection terminal part is opened in this protective film, thereby completing preprocessing.

As hereinabove described, the multilayer films (ONO films) 3 for forming charge holding films can be selectively formed on both side walls of the trenches 6 in the method of fabricating the semiconductor memory device according to the first embodiment, whereby the semiconductor memory device can attain an excellent data holding property. Further, the multilayer films 3 can be formed in a self-aligned manner with respect to the impurity diffusion layers 2 serving as source/drain regions, whereby the memory cells can be refined.

(Second Embodiment)

A semiconductor memory device according to a second embodiment of the present invention is now described with reference to FIGS. 9 to 12.

The structure of the semiconductor memory device according to the second embodiment is substantially similar to that of the semiconductor memory device according to the first embodiment, to attain effects similar to those of the first embodiment.

A method of fabricating the semiconductor memory device according to the second embodiment is now described.

While the trenches 6 are formed by etching the silicon substrate 1 to pass through the impurity diffusion layers 2 formed on the overall surface of the memory cell array in the aforementioned first embodiment, trenches 6 are formed after impurity diffusion layers 2 are selectively formed on a main surface of a silicon substrate 1 in the second embodiment. Effects similar to those of the first embodiment can be expected also in the second embodiment.

The method of fabricating the semiconductor memory device according to the second embodiment is now described with reference to FIGS. 9 to 12.

Figure 9:
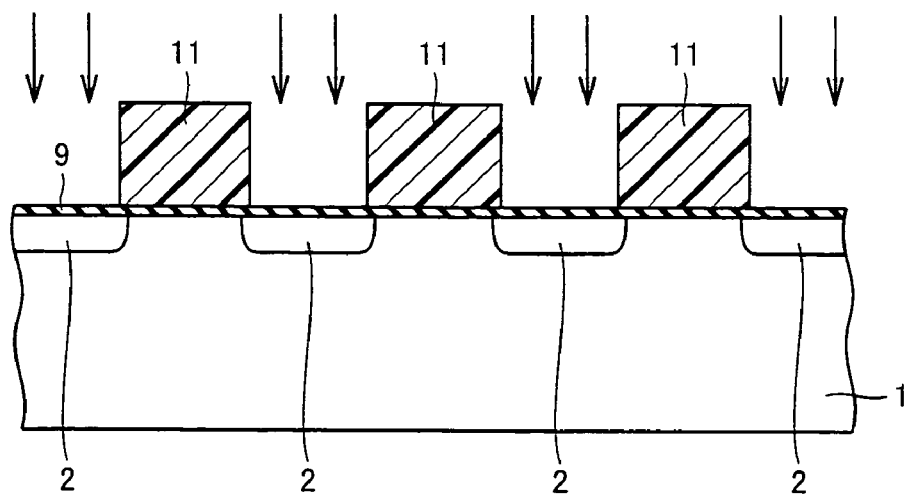
FIGS. 9 to 14 are sectional views showing first to sixth steps of fabricating a semiconductor memory device according to a second embodiment of the present invention.
Figure 10:
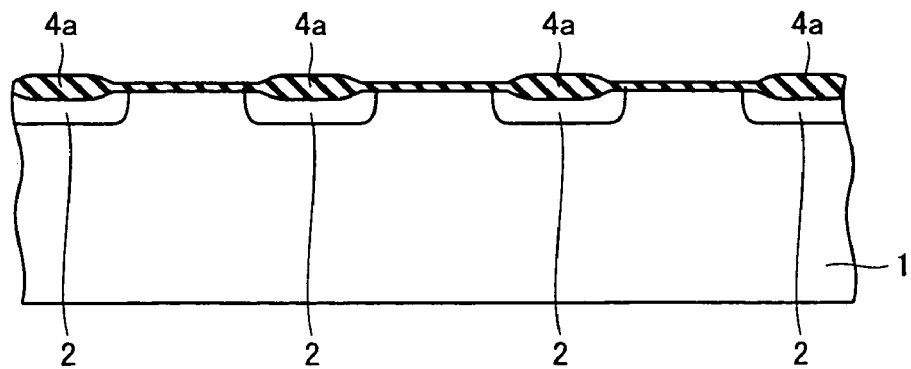

As shown in FIG. 9, a silicon oxide film 9 for preventing damage and contamination in impurity introduction is formed on the main surface of the p-type silicon substrate 1 (or a p-type well) by thermal oxidation or the like with a thickness of about 5 to 30 nm. Thereafter a resist pattern 11 is formed on the silicon oxide film 9 by photolithography and employed as a mask for introducing an n-type impurity into the main surface of the silicon substrate 1 by ion implantation or the like by about 0.1 to $5 \times 10^{15}$/cm², thereby forming impurity diffusion layers 2.

After the resist pattern 11 is removed, thermal oxidation is performed at a relatively low temperature of about 750° C. to 950° C. Thus, silicon oxide films (insulator films) 4a are formed on the overall portion of the main surface of the silicon substrate 1 located in a memory cell array. At this time, the surfaces of the impurity diffusion layers 2 are so subjected to enhanced oxidation that thick oxide films are formed on the surfaces of the impurity diffusion layers 2 in a self-aligned manner as compared with oxide films on portions of the main surface of the silicon substrate 1 located between the impurity diffusion layers 2. In other words, relatively thick oxide films (first oxide films) are formed on the impurity diffusion layers 2, while relatively thin oxide films (second oxide films) can be formed on the portions of the main surface of the silicon substrate 1 located between the impurity diffusion layers 2.

Figure 11:
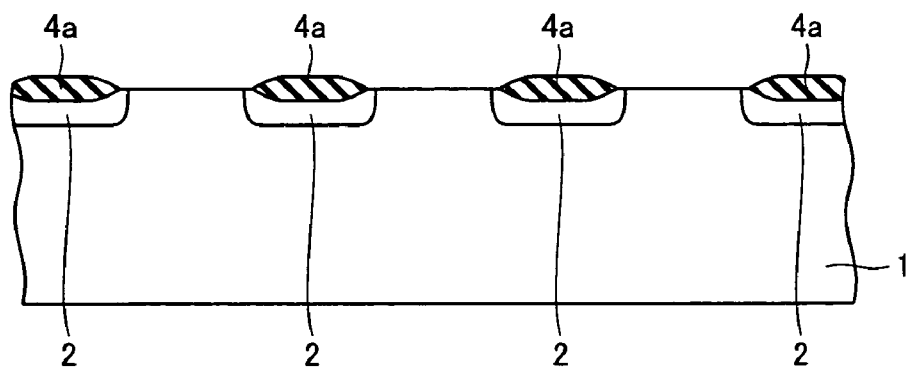

Then, the silicon oxide films 4a are removed from the portions of the main surface of the silicon substrate 1 located between the impurity diffusion layers 2 by wet or dry etching. Thus, the silicon oxide films 4a can be left on the surfaces of the impurity diffusion layers 2 while exposing the portions of the main surface of the silicon substrate 1 located between the impurity diffusion layers 2, as shown in FIG. 11.

Figure 12:
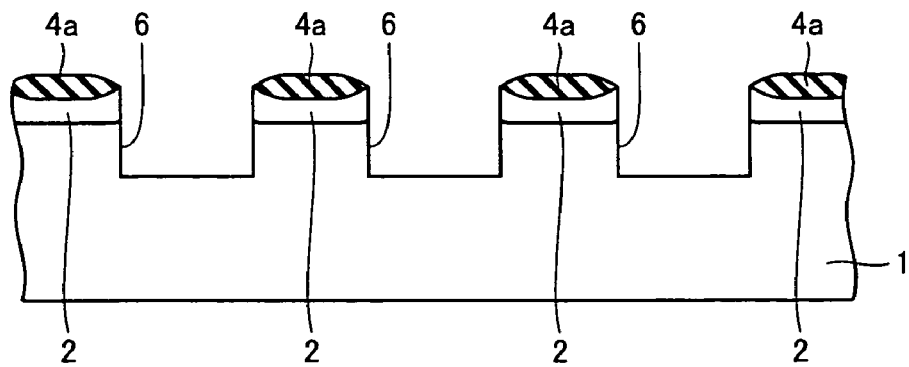

As shown in FIG. 12, the silicon oxide films 4a provided on the surfaces of the impurity diffusion layers 2 are employed as masks for dry-etching the portions of the silicon substrate 1 located between the impurity diffusion layers 2. Thus, the plurality of trenches 6 are formed in a self-aligned manner with respect to the impurity diffusion layers 2, while the impurity diffusion layers 2 can be left on both sides of the trenches 6.

Figure 13:
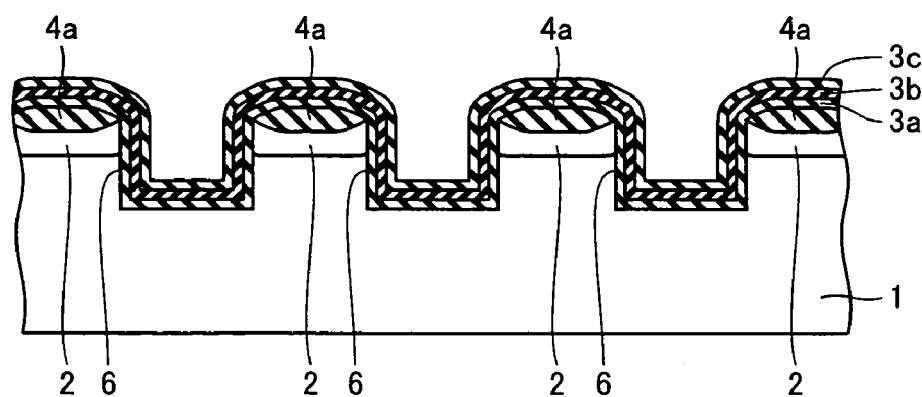

As shown in FIG. 13, first silicon oxide films 3a of about 1 to 5 nm in thickness are formed on the surfaces of the trenches 6 and the silicon oxide films 4a by thermal oxidation or the like, and silicon nitride films 3b of about 3 to 10 nm in thickness are deposited on the first silicon oxide films 3a by CVD or the like. Then, the surfaces of the silicon nitride films 3b are thermally oxidized for forming thermal oxide films of about 0.5 to 5 nm in thickness on the surfaces of the silicon nitride films 3b or oxide films of about 2 to 8 nm in thickness are deposited on the surfaces of the silicon nitride films 3b by CVD or the like. Thus, second silicon oxide films 3c can be formed on the surfaces of the silicon nitride films 3b, for forming ONO films constituted of the second silicon oxide films 3c, the silicon nitride films 3b and the first silicon oxide films 3a.

Figure 14:
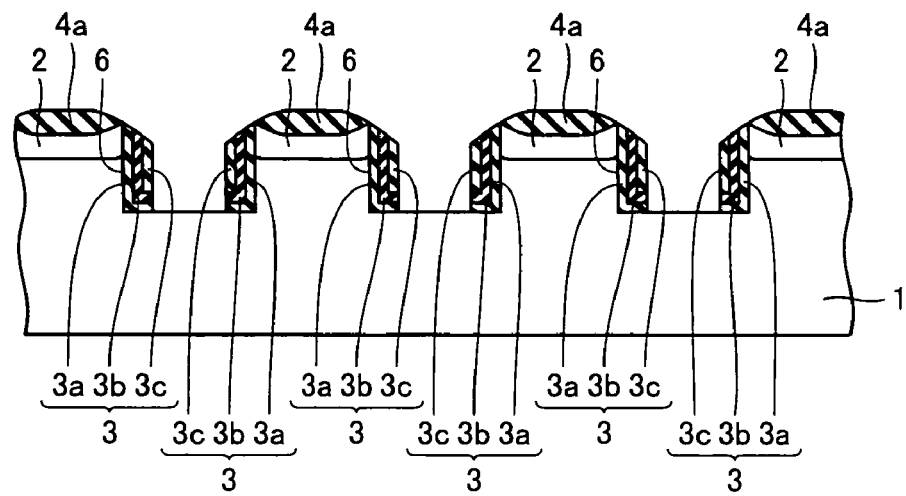

As shown in FIG. 14, the ONO films are etched back by anisotropic dry etching thereby removing the ONO films from the surfaces of the silicon oxide films 4a and the bottoms of the trenches 6 and exposing parts of the bottom surfaces of the trenches 6 and the silicon oxide films 4a while leaving the ONO films on the side walls of the trenches 6. Thus, pairs of multilayer films 3 constituted of the ONO films can be formed on the opposite side walls of the trenches 6.

Thereafter the semiconductor memory device according to the second embodiment can be fabricated through steps similar to those in the first embodiment.

(Third Embodiment)

A semiconductor memory device according to a third embodiment of the present invention is described with reference to FIGS. 15 to 19.

Figure 15:
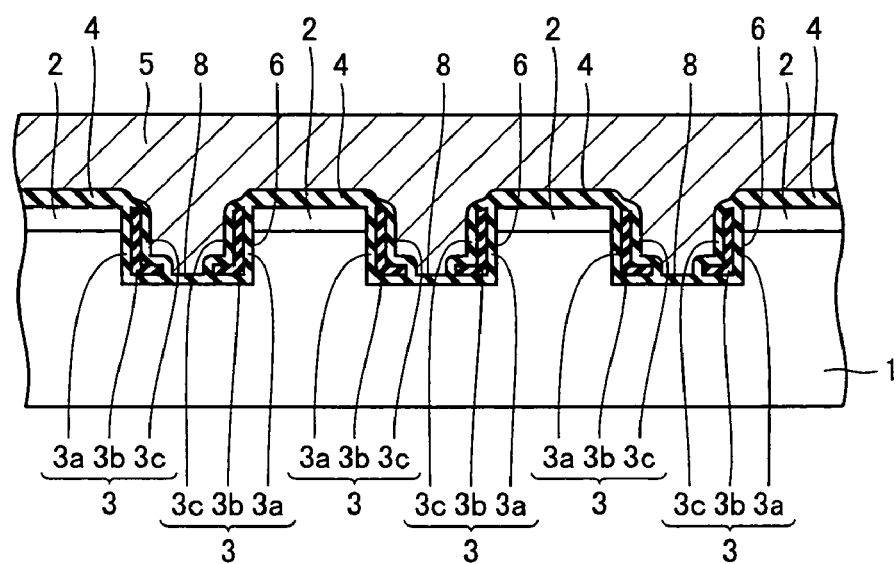
FIG. 15 is a partially fragmented sectional view of a semiconductor memory device according to a third embodiment of the present invention.

FIG. 15 is a partially fragmented sectional view of the semiconductor memory device according to the third embodiment. As shown in FIG. 15, multilayer films 3 extend from side walls onto bottom surfaces of trenches 6. In other words, first and second storage holding parts extend from the side walls onto the bottom surfaces of the trenches 6. Thus, the areas of charge holding films (storage holding parts) occupying channels of memory cells are so increased as to increase ON/OFF ratios of current values of the memory cells and simplify data reading.

A method of fabricating the semiconductor memory device according to the third embodiment is now described with reference to FIGS. 16 to 19.

Figure 16:
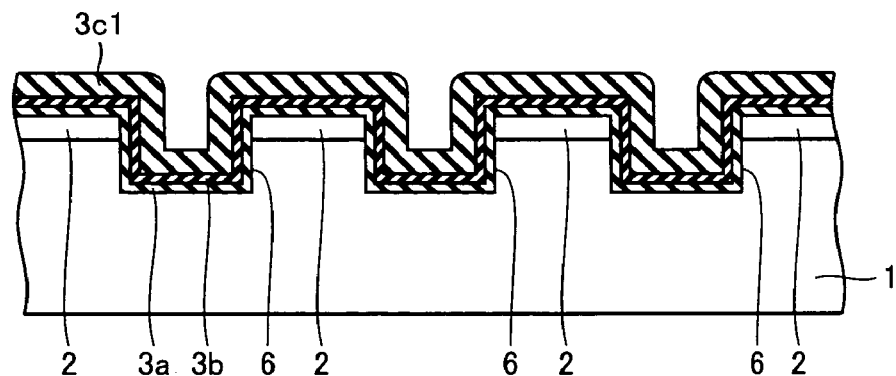
FIGS. 16 to 19 are sectional views showing first to fourth characteristic steps of manufacturing the semiconductor memory device according to the third embodiment of the present invention.

Films up to silicon nitride films 3b are formed through steps similar to those in the first embodiment. As shown in FIG. 16, second silicon oxide films 3c1 of about 20 to 200 nm in thickness are deposited on the silicon nitride films 3b by CVD or the like. The second silicon oxide films 3c1 are larger in thickness than first silicon oxide films 3a and the silicon nitride films 3b (at least about 10 times, for example).

Figure 17:
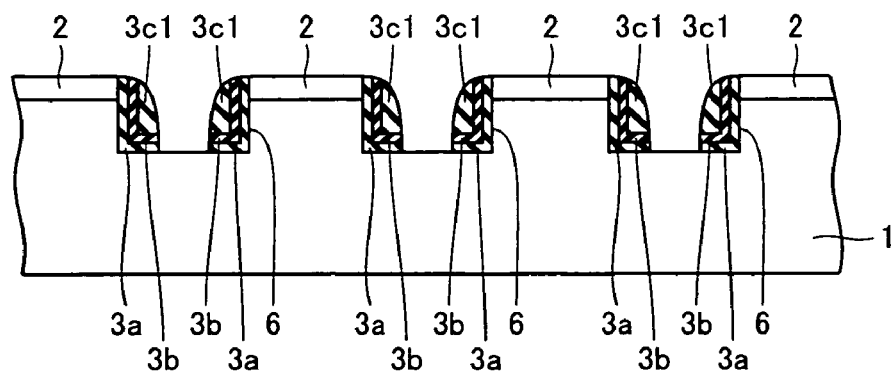

Then, ONO films constituted of the second silicon oxide films 3c1, the silicon nitride films 3b and the first silicon oxide films 3a are etched back by anisotropic dry etching. Thus, the surfaces of impurity diffusion layers 2 and parts of the bottom surfaces of trenches 6 are exposed as shown in FIG. 17. At this time, side wall spacers constituted of the second silicon oxide films 3c1 can be formed on the silicon nitride films 3b due to the large thickness of the second silicon oxide films 3c1. Further, the first silicon oxide films 3a and the silicon nitride films 3b can be left under the side wall spacers in bent shapes, while the first silicon oxide films 3a and the silicon nitride films 3b can be extended onto the bottom surfaces of the trenches 6.

Figure 18:
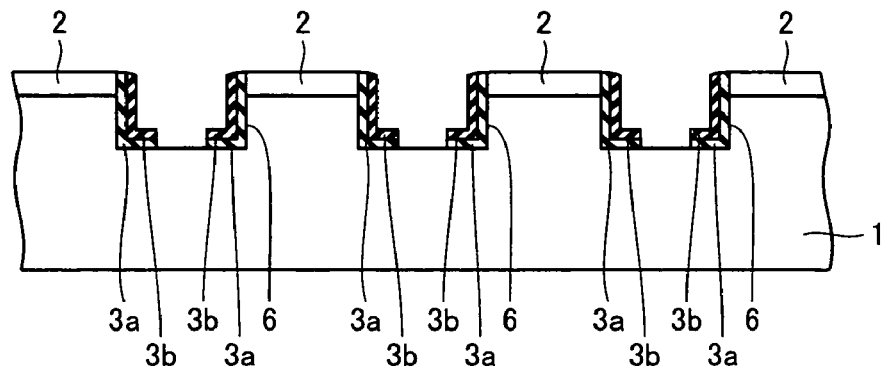
Figure 19:
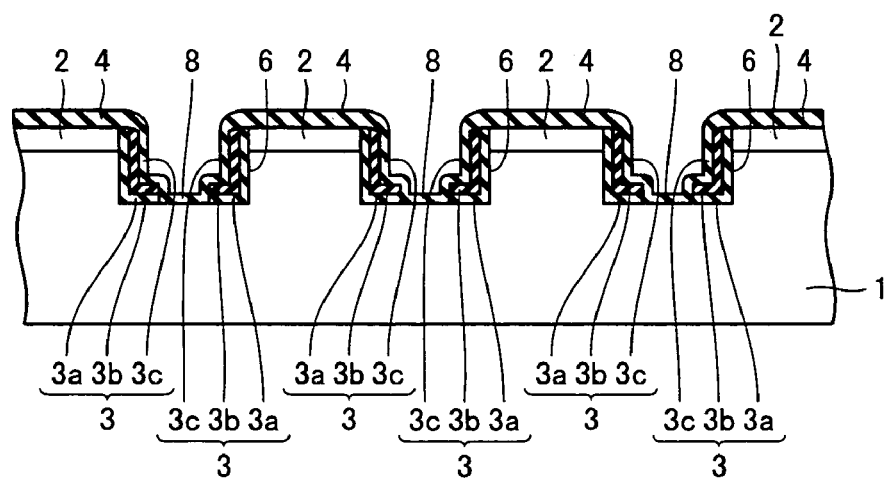

As shown in FIG. 18, the side wall spacers are removed by wet etching with a hydrofluoric acid-based solution. Thereafter oxide films are formed on the bottom surfaces of the trenches 6, the silicon nitride films 3b and the impurity diffusion layers 2 by thermal oxidation or the like. Thus, gate oxide films 8 on the bottom surfaces of the trenches 6, second silicon oxide films 3c on the silicon nitride films 3b and silicon oxide films 4 on the impurity diffusion layers 2 can be simultaneously formed as shown in FIG. 19. Consequently, pairs of multilayer films 3 constituted of the ONO films can be formed to extend from the opposite side walls onto the bottom surfaces of the trenches 6.

Thereafter the semiconductor memory device according to the third embodiment can be fabricated through steps similar to those of the first embodiment.

(Fourth Embodiment)

A semiconductor memory device according to a fourth embodiment of the present invention is now described with reference to FIGS. 20 to 23.

A fabrication method according to the fourth embodiment is a combination of the fabrication methods according to the second and third embodiments. The structure of the semiconductor memory device according to the fourth embodiment is substantially similar to that of the semiconductor memory device according to the third embodiment, and hence the semiconductor memory device according to the fourth embodiment can attain effects similar to those of the semiconductor memory device according to the third embodiment.

The method of fabricating the semiconductor memory device according to the fourth embodiment is now described.

Figure 20:
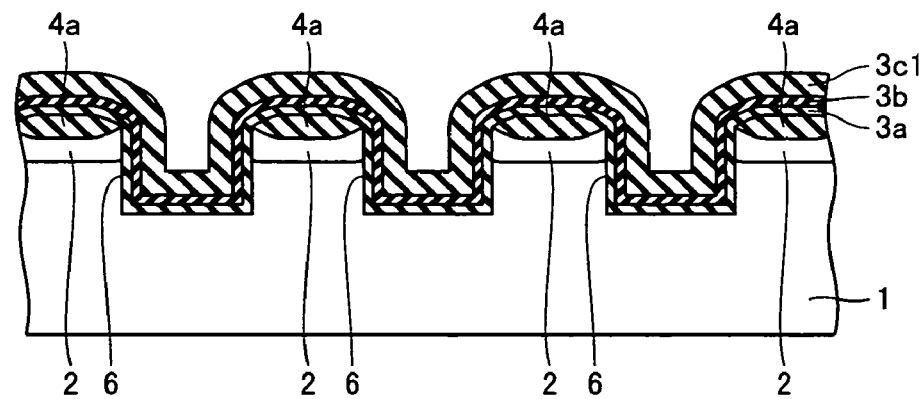
FIGS. 20 to 23 are sectional views showing first to fourth characteristic steps of fabricating a semiconductor memory device according to a fourth embodiment of the present invention.

First, films up to silicon nitride films 3b are formed through steps similar to those of the second embodiment. As shown in FIG. 20, second silicon oxide films 3c1 of about 20 to 200 nm in thickness are deposited on the silicon nitride films 3b. The second silicon oxide films 3c1 are larger in thickness than first silicon oxide films 3a and the silicon nitride films 3b.

Figure 21:
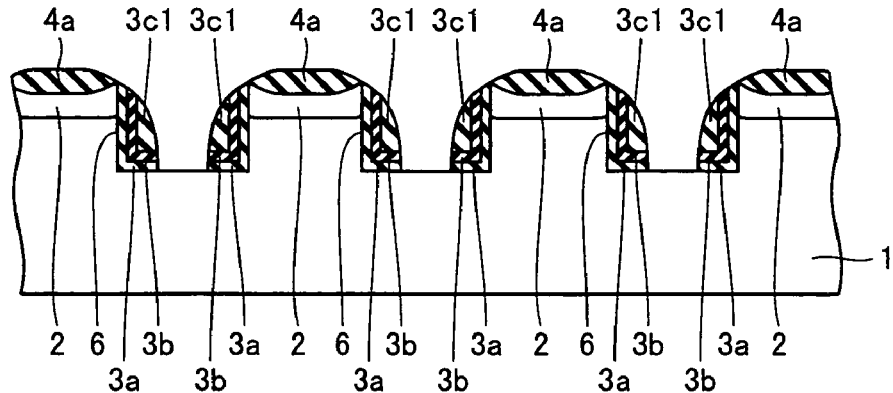

Then, ONO films constituted of the second silicon oxide films 3c1, the silicon nitride films 3b and the first silicon oxide films 3a are etched back by anisotropic dry etching. Thus, the surfaces of silicon oxide films 4a and parts of the bottom surfaces of trenches 6 are exposed as shown in FIG. 21. At this time, side wall spacers constituted of the second silicon oxide films 3c1 can be formed on the silicon nitride films 3b due to the large thickness of the second silicon oxide films 3c1. Further, the first silicon oxide films 3a and the silicon nitride films 3b can be left under the side wall spacers in bent shapes, while the first silicon oxide films 3a and the silicon nitride films 3b can be extended onto the bottom surfaces of the trenches 6.

Figure 22:
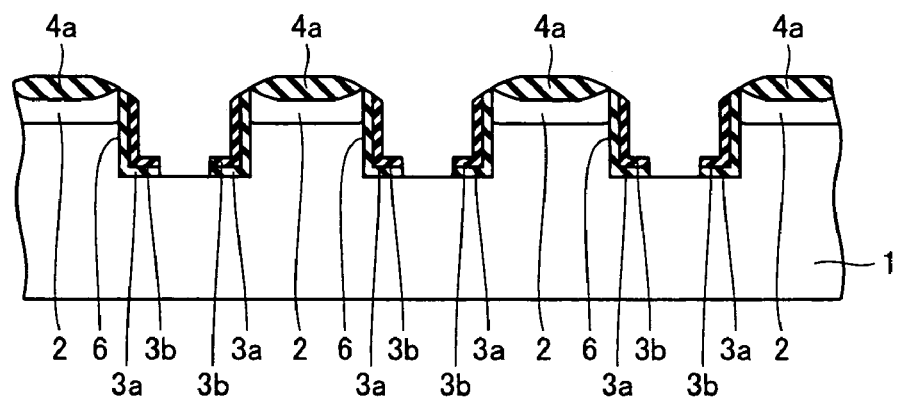
Figure 23:
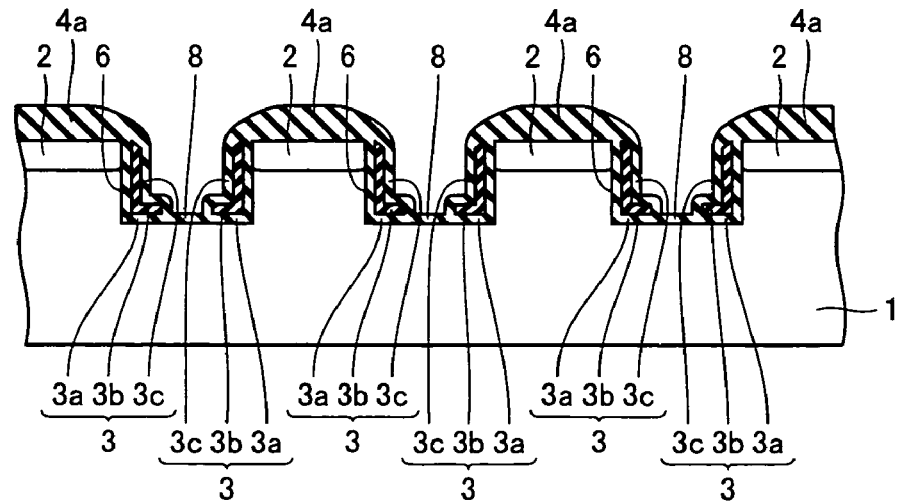

As shown in FIG. 22, the side wall spacers are removed by wet etching with a hydrofluoric acid-based solution. Thereafter gate oxide films (gate insulator films) 8 and second silicon oxide films 3c can be simultaneously formed on the bottom surfaces of the trenches 6 and the silicon nitride films 3b respectively by thermal oxidation or the like. Consequently, pairs of multilayer films 3 constituted of the ONO films can be formed to extend from the opposite side walls onto the bottom surfaces of the trenches 6.

Thereafter the semiconductor memory device according to the fourth embodiment can be fabricated through steps similar to those of the first to third embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a first conductivity type semiconductor substrate having a main surface;
a first gate electrode formed on the semiconductor substrate;
a second gate electrode formed on the semiconductor substrate, parallel to the first gate electrode;
a trench formed on said semiconductor substrate to open in said main surface and to cross the first and second gate electrodes; and
first and second memory cells formed on said trench at an interval, wherein
said first memory cell includes:
a first storage holding part formed on a first side wall of said trench,
a second storage holding part formed on a second side wall of said trench, and
second conductivity type first and second impurity diffusion layers formed on both sides of said first and second storage holding parts, wherein
the first gate electrode is formed to extend from said trench onto said first and second impurity diffusion layers for covering said first and second storage holding parts, and
said second memory cell includes:
a third storage holding part formed on said first side wall of said trench,
a fourth storage holding part formed on said second side wall of said trench, and
second conductivity type third and fourth impurity diffusion layers formed on both sides of said third and fourth storage holding parts, wherein
the second gate electrode is formed to extend from said trench onto said third and fourth impurity diffusion layers for covering said third and fourth storage holding parts,
the first storage holding part of the first memory cell is electrically isolated from the third storage holding part of the second memory cell,
the second storage holding part of the first memory cell is electrically isolated from the fourth storage holding part of the second memory cell, and
each of the first, second, third and fourth storage holding parts comprises a first silicon oxide film stacked on a respective side wall of said trench, a silicon nitride film stacked on the first silicon oxide film and a second silicon oxide film stacked on the silicon nitride film.

* * * * *